United States Patent
An et al.

[11] Patent Number: 5,804,874
[45] Date of Patent: Sep. 8, 1998

[54] STACKED CHIP PACKAGE DEVICE EMPLOYING A PLURALITY OF LEAD ON CHIP TYPE SEMICONDUCTOR CHIPS

[75] Inventors: Min Cheol An; Do Soo Jeong, both of Suwon, Rep. of Korea

[73] Assignee: Samsung Electronics Co., Ltd., Suwon, Rep. of Korea

[21] Appl. No.: 811,150

[22] Filed: Mar. 4, 1997

[30] Foreign Application Priority Data

Mar. 8, 1996 [KR] Rep. of Korea .................... 1996 6069

[51] Int. Cl.⁶ ................................. H01L 23/495
[52] U.S. Cl. ...................... 257/676; 257/686; 257/724; 257/725
[58] Field of Search ................... 257/676, 686, 257/724, 725

[56] References Cited

U.S. PATENT DOCUMENTS

| 5,299,092 | 3/1994 | Yaguchi et al. | 257/686 |
|---|---|---|---|
| 5,332,922 | 7/1994 | Oguchi et al. | 257/723 |
| 5,438,224 | 8/1995 | Papageorge et al. | 257/686 |
| 5,463,253 | 10/1995 | Waki et al. | 257/724 |
| 5,471,369 | 11/1995 | Honda et al. | 257/686 |
| 5,479,051 | 12/1995 | Waki et al. | 257/725 |
| 5,530,292 | 6/1996 | Waki et al. | 257/724 |
| 5,539,250 | 7/1996 | Kitano et al. | 257/725 |
| 5,579,208 | 11/1996 | Honda et al. | 257/686 |
| 5,689,135 | 11/1997 | Ball | 257/724 |

*Primary Examiner*—David Ostrowski
*Attorney, Agent, or Firm*—Jones & Volentine, L.L.P.

[57] ABSTRACT

A stacked chip package comprising an upper part including an upper semiconductor chip having a plurality of electrode bonding pads disposed on a central region of an active surface of the semiconductor chip; an upper lead frame having leads extending over the active surface of the upper semiconductor chip and which are electrically interconnected to the electrode bonding pads of the semiconductor chip; a lower part including a lower semiconductor chip having a plurality of electrode bonding pads disposed on a central region of an active surface of the semiconductor chip; a lower lead frame having inner leads extending over the active surface of the lower semiconductor chip which are electrically interconnected to the electrode bonding pads of the lower semiconductor chip, and outer leads for electrical interconnecting the stacked chip package to an external circuit device. The leads of the upper lead frame are formed to directly contact top surfaces of the inner leads of the lower lead frame, so that the upper and the lower parts can be electrically interconnected. An insulating adhesive film is interposed between the upper semiconductor chip and the inner leads of the lower lead frame.

12 Claims, 7 Drawing Sheets

PIN NAME

| | |
|---|---|
| A0~A11 | ADDRESS INPUTS |
| DQ0~3 | DATA INPUT/OUTPUT |
| WE | READ/WRITE INPUT |
| OE | OUTPUT ENABLE |
| RAS | ROW ADDRESS STROBE |
| CAS | COLUMN ADDRESS STROBE |
| VCC | POWER (+5V) |
| VSS | GROUND |
| NC | NO CONNECTION |

PIN CONFIGURATION

| PIN NO. | SYMBOL | PIN NO. | SYMBOL |
|---|---|---|---|
| 1 | VCC | 15 | VSS |
| 2 | DQ0 | 16 | A4 |
| 3 | DQ1 | 17 | A5 |
| 4 | WE | 18 | A6 |
| 5 | RAS0 | 19 | A7 |
| 6 | RAS1 | 20 | A8 |
| 7 | A11 | 21 | NC |
| 8 | NC | 22 | NC |
| 9 | A10 | 23 | A9 |
| 10 | A0 | 24 | OE |
| 11 | A1 | 25 | CAS |
| 12 | A2 | 26 | DQ2 |
| 13 | A3 | 27 | DQ3 |
| 14 | VCC | 28 | VSS |

STACKED CHIP PACKAGE DEVICE EMPLOYING A PLURALITY OF LEAD ON CHIP TYPE SEMICONDUCTOR CHIPS

BACKGROUND OF THE INVENTION

1. Field of the Invention

The present invention generally relates to a stack package device, and more particularly, to a stack package device employing Lead-On-Chip (LOC) technology that can use the existing assembly technology and instruments, and that can reduce the thickness of the package device.

2. Description of the Related Arts

In a LOC device, a die pad of a lead frame is not used. Instead, an inner lead portion of a lead frame extends over and attaches to an active surface of a semiconductor chip to be packaged. Then electrode bonding pads of the chip are electrically interconnected to the corresponding inner lead portion.

Conventional stack package devices employ a three dimensional stacking technology comprising a plurality of semiconductor chips within a single package body. The stack package device is suitable for use in increasing memory capacity of DRAM (Dynamic Random Access Memory) package devices.

FIG. 1 is a cross sectional view of a conventional LOC type stack package device disclosed in U.S. Pat. No. 5,332,922. Two semiconductor chips, i.e., lower chip 10 and upper chip 20, are mounted so as to face each other, and inner leads 30 and 40 thereof are attached to active surfaces of the chips by way of polyimide tapes 50 and 60, respectively. Electrode bonding pads (not shown) of the upper and lower chips 20 and 10 are electrically interconnected to the corresponding inner leads by bonding wires 70 and 80, respectively. The semiconductor chips 10 and 20, the inner leads 30 and 40, and the bonding wires 70 and 80 are protected from an external environment by a mold resin package body 90.

The inner leads 30 of the lower semiconductor chip 10 are formed as one body with outer leads 35 of the package device 100. The outer leads 35 protrude from the package body 90, and are formed in a configuration suitable for being mounted on and electrically connected to an external electronic system such as a Printed Circuit Board. The inner leads 40 associated with the upper chip 20 are bonded to their counterpart leads 30 by using a YAG laser beam.

However, in the conventional LOC stack package device, upper and lower semiconductor chips must be spaced apart enough to prevent electrical shorts between the bonding wires 70 and 80. This acts as a limitation in reducing the thickness of the stack package device. Moreover, because the lead frame leads are bent several times, the assembly process for the stack package becomes complicated.

SUMMARY OF THE INVENTION

Therefore, it is an object of the present invention to provide a stacked chip package device employing LOC type chips which can reduce the thickness of the package device while still preventing electrical shorts.

Another object of the present invention is to simplify the assembly process for the stacked chip package device.

According to a significant aspect of the present invention, there is provided a stacked chip package comprising: an upper part comprising an upper semiconductor chip having a plurality of electrode bonding pads disposed on a central region of an active surface of the semiconductor chip, an upper lead frame having leads extending over the active surface of the upper semiconductor chip and which are electrically interconnected to the electrode bonding pads of the semiconductor chip; a lower part comprising a lower semiconductor chip having a plurality of electrode bonding pads disposed on a central region of an active surface of the semiconductor chip, a lower lead frame having inner leads extending over the active surface of the lower semiconductor chip which are electrically interconnected to the electrode bonding pads of the lower semiconductor chip, and outer leads for electrical interconnecting the stacked chip package to an external circuit device, wherein the leads of the upper lead frame are formed to directly contact top surfaces of the inner leads of the lower lead frame, so that the upper and the lower parts can be electrically interconnected; and an insulating adhesive film interposed between the upper semiconductor chip and the inner leads of the lower lead frame.

BRIEF DESCRIPTION OF THE DRAWINGS

This invention may be understood and its objects will become apparent to those skilled in the art by reference to the accompanying drawings, in which.

DETAILED DESCRIPTION OF THE PRESENT INVENTION

Now preferred embodiments of the present invention will be explained with reference to the accompanying drawings.

Figure 1:
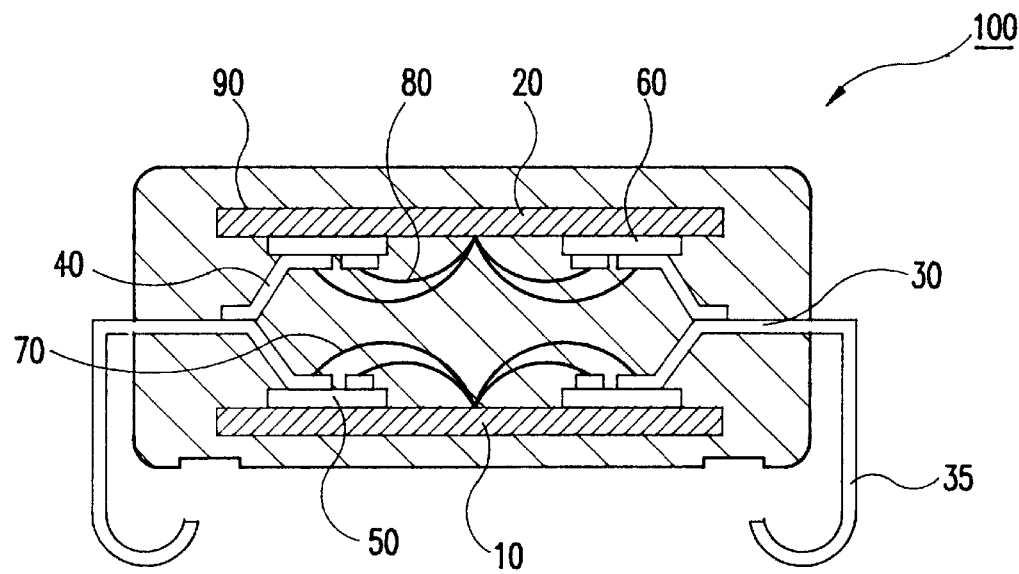
FIG. 1 is a cross sectional view of a conventional stack package device.
Figure 2:
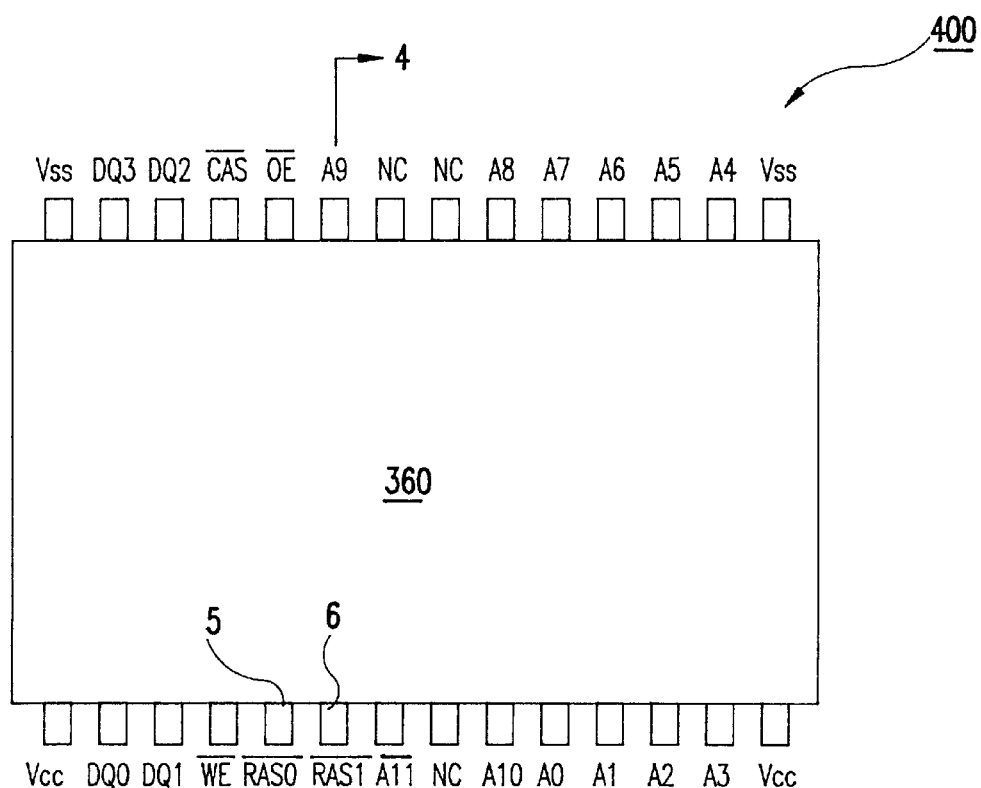
FIG. 2 is a plan view of a LOC type stack package device according to one embodiment of the present invention.
Figures 3, 3A, 3B:
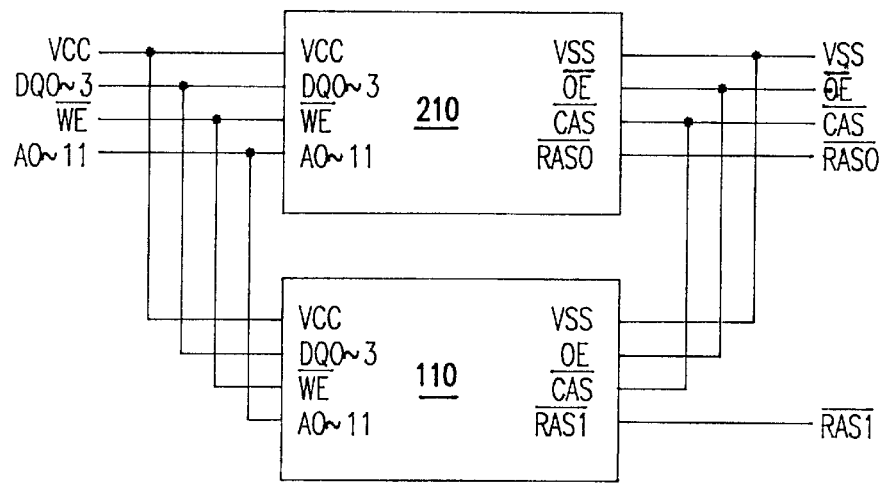
FIG. 3 is a block circuit diagram of the stack package device of FIG. 2.
Figure 4:
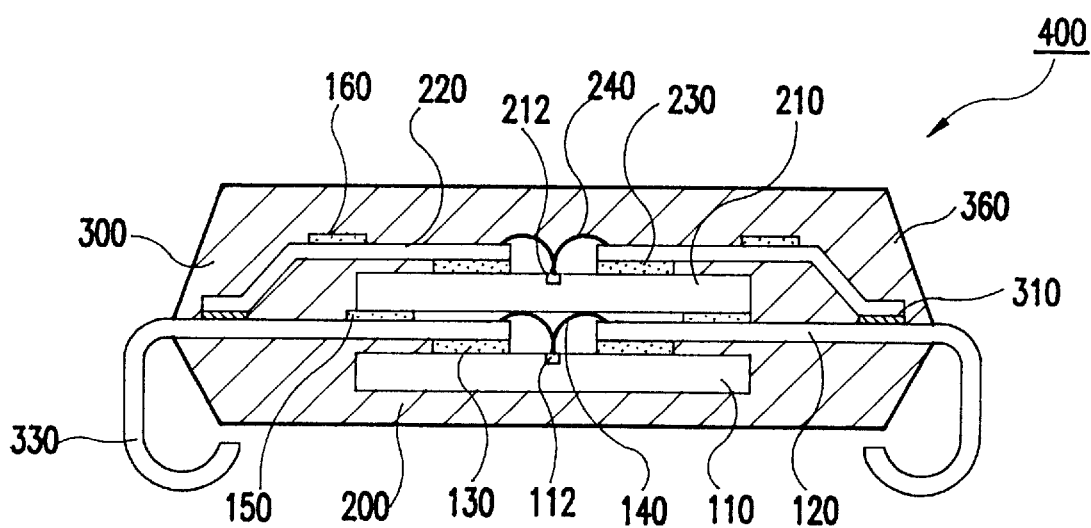
FIG. 4 is a cross sectional view taken into a line 4—4 of FIG. 2.
Figure 5:
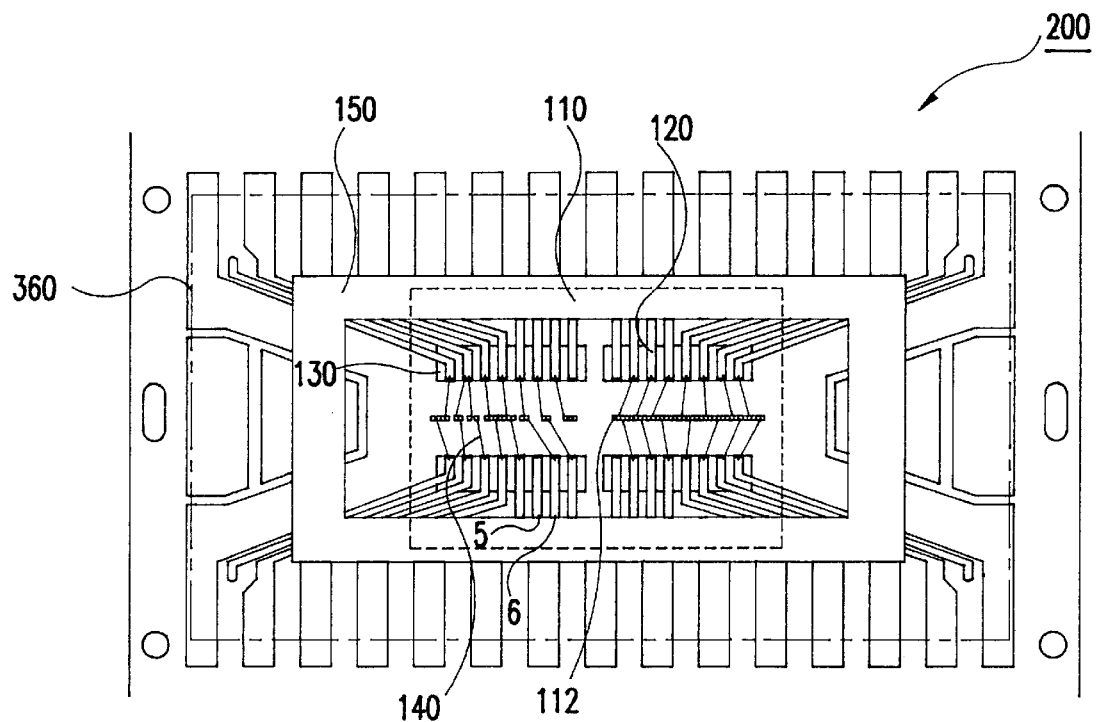
FIG. 5 is a top plan view for showing a configuration of the lower part of the package device of FIG. 4.
Figure 6:
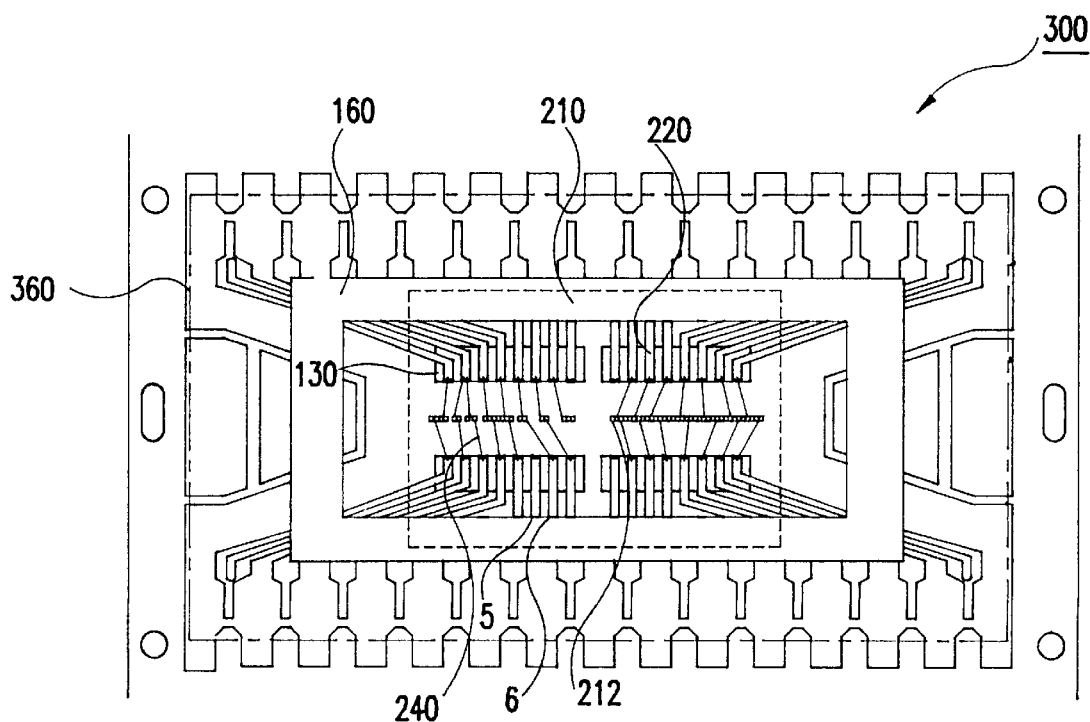
FIG. 6 is a top plan view for showing a configuration of the upper part of the package device of FIG. 4.
Figure 7:
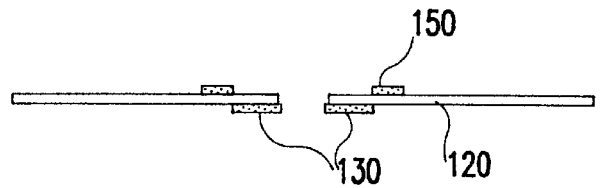
FIGS. 7 to 13 are cross sectional views for illustrating the manufacturing process of the stacked chip package device according to the present invention.

FIG. 2 is a plan view of a LOC type stack package device according to one embodiment of the present invention, FIG. 3 is a block circuit diagram of the stack package device of FIG. 2, FIG. 4 is a cross sectional view taken into a line 4—4 of FIG. 2, FIG. 5 is a top plan view for showing a configuration of the lower part of the package device of FIG. 4, and FIG. 6 is a top plan view for showing a configuration of the upper part of the package device of FIG. 4. Referring to FIGS. 2 to 6, the package device 400 of this invention can be embodied by stacking two 16M DRAMs. Electrical interconnection part 310, between inner leads 120 of lower part 200 and inner leads 220 of upper part 300, can be formed by a thermo-compression method with electrically conductive material deposited on the joint. Alternatively, a solder reflow method, electrically conductive adhesive tapes, or a YAG laser method can be employed for the electrical interconnection part 310.

Outer leads 330 of lower part 200 are commonly connected to the inner leads 120 and 220, and are formed as one body with the inner leads 120 of the lower part 200. Except for the outer leads 330, the upper and lower parts 200 and 300 are encapsulated with an epoxy mold resin 360.

To prevent the physical contact between the upper and lower parts 200 and 300, an insulating film 150 made of polyimide is interposed between the top surface of the inner leads 120 of the lower part 200 and the bottom surface of the semiconductor chip 210 of the upper part 300. The polyimide insulating film may be a double-sided adhesive film. The interposed insulating film 150 must be thick enough to ensure that the bottom surface of the chip 210 of the upper part 300 will not contact the bonding wires 140 of the lower part 200.

In the lower part 200 of the package device 400, long inner leads 120 extend over the active surface of the semiconductor chip 110, and are attached to the active surface by polyimide tape 130. Electrode bonding pads 112, disposed in a central region of the chip 110, are electrically interconnected to the respective inner leads 120 by bonding wires 140.

Meanwhile, long inner leads 220 of the upper part 300 of the package device 400 extend over the active surface of the semiconductor chip 210, and are adhered to the active surface by polyimide tape 230. Electrode bonding pads 212 formed in a central region of the chip 210 are electrically interconnected to the respective inner leads 220 by bonding wires 240. The lead frame leads of the upper part are cut off and separated from the guide rail of the lead frame, and supported by the insulating adhesive tape 160. The outer ends of the inner leads 220 of the upper part 300 are bent downward for electrical interconnection with the inner leads 120 of the lower part 200.

If the stacked chips are memory devices, the pin configuration of the memory chip is as shown in FIG. 2, and electrical interconnection in the stacked structure may be accomplished as shown in FIG. 3. Address signals A0 to A11, used for addressing specific storage cells in a memory chip, and data input/output signals DQ0 to DQ3 are commonly connected to both of the chips 110 and 210. Power supply signals VCC and VSS, and control signals WE, OE and CAS are also commonly connected. Control signals RAS0 and RAS 1 select one of the two stacked memory chips. A lead associated with RAS0 is wire bonded to the memory chip 210 of the upper part 300, while RAS 1 is connected to the memory chip 110 of the lower part. For example, referring to FIGS. 2 and 5, there is shown a lead corresponding to a package pin numbered 5 (RAS0) that is not wire bonded to any electrode bonding pad, but a lead corresponding to pin 6 (RAS1) is connected to the corresponding electrode bonding pad of the memory chip 110. On the other hand, for the upper chip 210, the interconnection of the bonding wires is reversed (as shown in FIG. 6), although the location of the electrode bonding pad where pins 5 and 6 are connected are the same. Of course, it is possible to select stacked memory chips by using control signals CAS0 and CAS1, rather than RAS0 and RAS1. With this structure of stacked memory chips, a 32M DRAM device can be provided as a single package device, resulting in an increase in the memory capacity of the memory device.

FIGS. 7 to 13 are cross sectional views for illustrating the manufacturing process of the package device according to the present invention.

Figure 8:
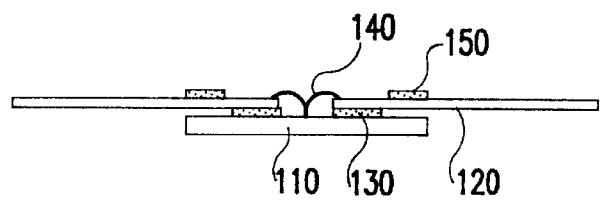

First, a lead frame for the lower part 200 is prepared. The lead frame 120 is in strip form, and bottom surfaces of the lead frame leads are provided with insulating adhesives 130 for later bonding with a semiconductor chip. Leads 120 are supported by an insulating tape 150 attached to the top surface of the leads (see FIG. 7). To this LOC type lead frame there is bonded the semiconductor chip 110 and the lead frame leads 120 are electrically interconnected to the chip by bonding wires 140 (FIG. 8).

Figure 9:
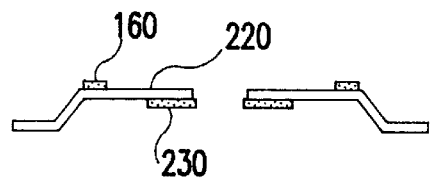
Figure 10:
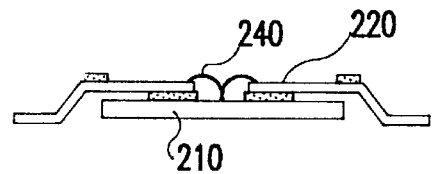

A lead frame 220 used for the upper part 300 also has an insulating adhesive 230 attached to the bottom of the leads, and an insulating tape 160 adhered to the top surface of the leads. However, this lead frame is not in strip form but is separated from the guide rail of the lead frame as shown in FIG. 6. A number of leads are coupled and supported by the top insulating tape 160, and outer end portions of the leads are formed for connection to the leads of the lower part (FIG. 9). After bonding the semiconductor chip 210 to the bottom of the leads 220, the chips are electrically interconnected to the leads by bonding wires 240 (FIG. 10).

Figure 11:
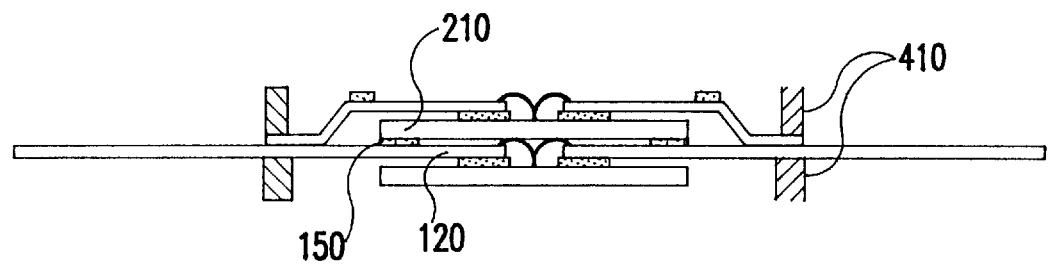
Figure 12:
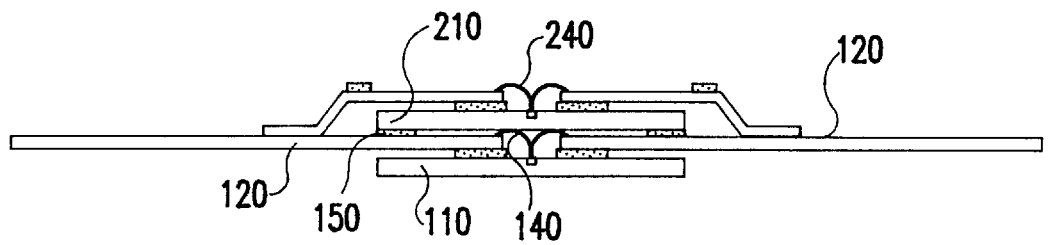

The semiconductor chip 210 of the upper part and leads 120 of the lower part are bonded by using an insulating film 150 that is thick enough to prevent the two bonding wires 240 and 140 of the upper and the lower parts from contacting. The electrical interconnection between stacked semiconductor chips is accomplished by bonding lead frame leads of the upper and the lower parts using a thermocompressor 410 (FIGS. 11 and 12). It is preferable to pre-deposit the joint with a tin or a tin-lead alloy. Also, the leads of the upper and the lower parts can be connected by using a YAG laser or a solder reflow method.

Figure 13:
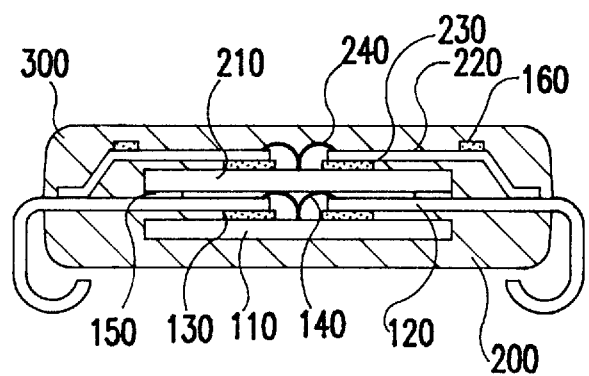

After a protective package body for the stacked upper and lower parts is formed, the leads 120 of the lower part are cut off from the guide rail and then formed into a final configuration, e.g., a J-shape (FIG. 13).

Figure 14:
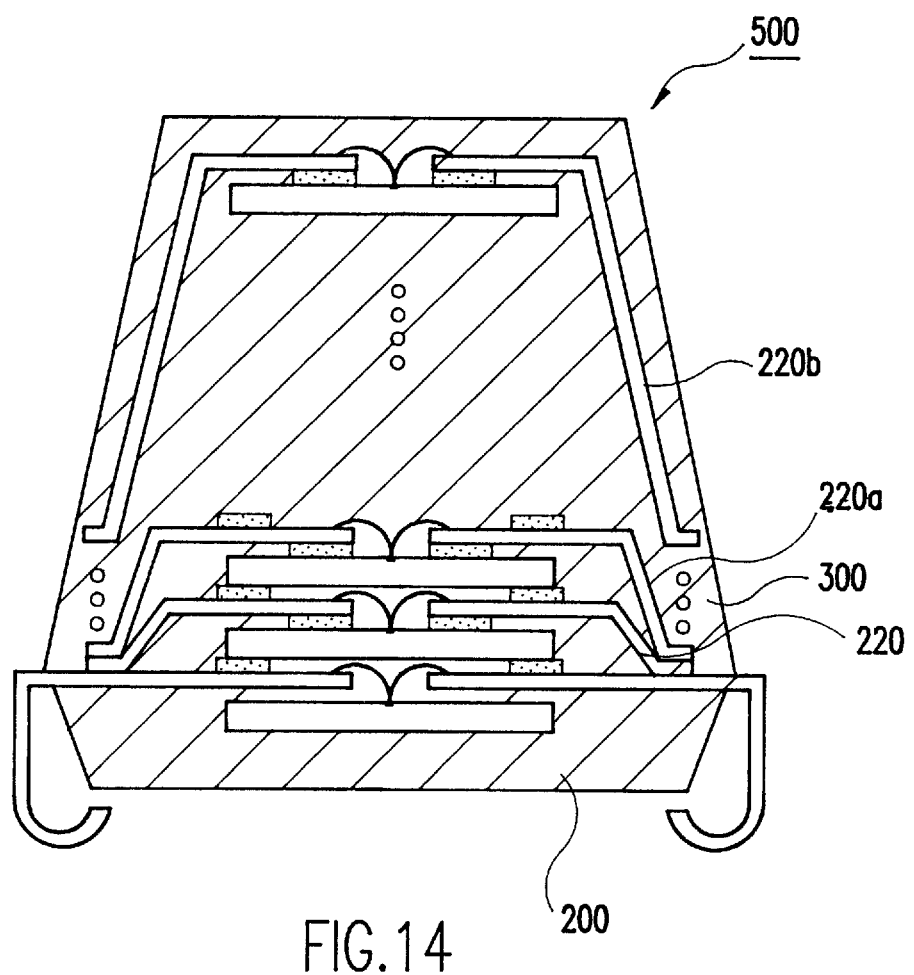
FIG. 14 is a front cross sectional view of the stacked chip package device according to another embodiment of the present invention.

FIG. 14 shows another embodiment of the stacked chip package according to the present invention. The lower part 200 of the stacked chip package device 500 is identical as explained before with reference to FIGS. 7 and 8, and the upper part 300 can be obtained by the processes as shown in FIGS. 8 and 9. Note that the higher the chip is stacked, the longer the lead frame leads. See, e.g., leads 220, 220a, and 220b in FIG. 14.

The present invention reduces the number of steps for forming the lead frame leads. Also, the present invention provides a thinner stacked chip package device having minimum electrical interference between the upper and the lower parts of the package device. Moreover, the present invention enables use of existing wire bonding and die bonding technologies for non-stacked single chip package device so that the reliability of the stacked chip package device can be improved and the production cost can be curtailed.

Although preferred embodiments of the present invention have been described in detail hereinabove, it should be clearly understood that many variations and/or modifications of the basic inventive concepts herein taught, which may appear to those skilled in the art, will still fall within the spirit and scope of the present invention as defined in the appended claims and their equivalents.

What is claimed is:

1. A stacked chip package comprising:
   an upper part comprising
      an upper semiconductor chip having a plurality of electrode bonding pads disposed on a central region of an active surface of the semiconductor chip, the active surface of the upper semiconductor chip facing an upper lead frame and facing away from a lower lead frame;
      said upper lead frame having leads extending over the active surface of the upper semiconductor chip and which are electrically interconnected to the electrode bonding pads of the semiconductor chip;

a lower part comprising a lower semiconductor chip having a plurality of electrode bonding pads disposed on a central region of an active surface of the semiconductor chip, the active surface of the lower semiconductor chip facing both said lower lead frame and upper lead frames;

said lower lead frame having inner leads extending over the active surface of the lower semiconductor chip which are electrically interconnected to the electrode bonding pads of the lower semiconductor chip, and outer leads for electrical interconnecting the stacked chip package to an external circuit device, wherein the leads of the upper lead frame are formed to directly contact top surfaces of the inner leads of the lower lead frame, so that the upper and the lower parts can be electrically interconnected; and an insulating adhesive film interposed between and simultaneously contacting the bottom surface of the upper semiconductor chip along entire lengths of two parallel edges of the chip, and the top surfaces of the inner leads of the lower lead frame.

2. The stacked chip package as claimed in claim 1, wherein the insulating adhesive film is a polyimide tape.

3. The stacked chip package as claimed in claim 1, wherein the leads of the upper lead frame and the inner leads of the lower lead frame are respectively attached to the active surfaces of the upper and the lower semiconductor chips by polyimide tapes.

4. The stacked chip package as claimed in claim 1, wherein the leads of the upper lead frame are cut off from a guide rail portion of the upper lead frame.

5. The stacked chip package as claimed in claim 1, wherein the electrical interconnection of the upper and the lower parts are accomplished by a thermo-compression method.

6. The stacked chip package as claimed in claim 5, wherein a tin-lead alloy is deposited on lead surfaces to be compressed.

7. The stacked chip package as claimed in claim 1, wherein the electrode bonding pads are electrically interconnected to the respective leads of the upper lead frame and the inner leads of the lower lead frame by bonding wires.

8. The stacked chip package as claimed in claim 7, wherein the insulating adhesive film is thick enough to prevent direct contact of the bonding wires.

9. The stacked chip package as claimed in claim 8, wherein the insulating adhesive film is a double-sided adhesive polyimide film.

10. The stacked chip package as claimed in claim 1, wherein the upper and the lower parts are encapsulated and protected by a single package body.

11. The stacked chip package as claimed in claim 10, wherein the outer leads of the lower part protrude from the package body and are formed in a J-shape.

12. The stacked chip package as claimed in claim 1, wherein more than two semiconductor chips are stacked with their respective active surfaces facing in the same direction as said active surface of the upper semiconductor chip.

* * * * *